(12) United States Patent
Grimm et al.

(10) Patent No.: US 8,947,884 B1
(45) Date of Patent: Feb. 3, 2015

(54) SUPPORT FOR A PRINTED CIRCUIT ASSEMBLY

(75) Inventors: Matthew Don Grimm, Leander, TX (US); Edward John Kliewer, Sunnyvale, CA (US); Kwok Keung Lee, Plana, TX (US); Sam David Blackwell, Round Rock, TX (US)

(73) Assignee: Cisco Technology, Inc., San Jose, CA (US)

( * ) Notice: Subject to any disclaimer, the term of this patent is extended or adjusted under 35 U.S.C. 154(b) by 371 days.

(21) Appl. No.: 13/172,181

(22) Filed: Jun. 29, 2011

(51) Int. Cl.
| | |
|---|---|
| *G06F 1/16* | (2006.01) |
| *H05K 5/00* | (2006.01) |
| *H05K 7/00* | (2006.01) |
| *H05K 7/20* | (2006.01) |
| *H05K 1/14* | (2006.01) |
| *H05K 1/00* | (2006.01) |
| *H05K 1/18* | (2006.01) |
| *H05K 7/14* | (2006.01) |
| *H05K 7/18* | (2006.01) |
| *H05K 7/02* | (2006.01) |
| *H05K 7/04* | (2006.01) |
| *G06F 1/18* | (2006.01) |
| *H05K 7/10* | (2006.01) |
| *H05K 7/12* | (2006.01) |

(52) U.S. Cl.
CPC ............ *H05K 5/0026* (2013.01); *H05K 7/1402* (2013.01); *H05K 7/1405* (2013.01); *G06F 1/183* (2013.01); *G06F 1/185* (2013.01); *H05K 5/00* (2013.01); *H05K 5/003* (2013.01); *H05K 5/0047* (2013.01); *H05K 5/006* (2013.01); *H05K 1/00* (2013.01); *H05K 7/14* (2013.01); *H05K 7/00* (2013.01); *H05K 7/02* (2013.01); *H05K 7/10* (2013.01); *H05K 7/12* (2013.01); *G06F 1/184* (2013.01); *G06F 1/186* (2013.01); *H05K 1/14* (2013.01)

USPC ................. 361/752; 361/679.31; 361/679.32; 361/679.33; 361/679.4; 361/679.41; 361/720; 361/736; 361/748; 361/754; 361/756; 361/758; 361/759; 361/760; 361/761; 361/798; 361/807

(58) Field of Classification Search
CPC . G06F 1/183–1/186; H05K 1/00; H05K 1/14; H05K 5/00; H05K 5/0026; H05K 5/003; H05K 5/0047; H05K 5/006; H05K 7/00; H05K 7/02; H05K 7/10; H05K 7/12; H05K 7/1402; H05K 7/1405
USPC ........... 361/807, 679.1–679.6, 748, 752, 798, 361/759, 754, 720, 736, 761, 756, 758, 760
See application file for complete search history.

(56) References Cited

U.S. PATENT DOCUMENTS

| | | | | |
|---|---|---|---|---|
| 6,128,196 | A * | 10/2000 | Hoyle et al. | 361/752 |
| 6,185,106 | B1 * | 2/2001 | Mueller | 361/798 |
| 6,567,274 | B1 * | 5/2003 | Tusan et al. | 361/740 |
| 6,603,657 | B2 * | 8/2003 | Tanzer et al. | 361/679.33 |
| 7,411,784 | B2 * | 8/2008 | Coglitore et al. | 361/679.41 |
| 7,492,598 | B2 | 2/2009 | Narasimhan et al. | |
| 7,725,142 | B2 * | 5/2010 | Fritz et al. | 455/575.1 |

* cited by examiner

*Primary Examiner* — Anthony Haughton
*Assistant Examiner* — Zhengfu Feng
(74) *Attorney, Agent, or Firm* — Edell, Shapiro & Finnan, LLC

(57) ABSTRACT

A device includes a printed circuit assembly (PCA) including a printed circuit board and at least one electronic component integrated with the printed circuit board, and a support to which the PCA is securable. At least one of the PCA and the support includes engaging structure elements, and some engaging structure elements are configured to secure the PCA to the support while other engaging structure elements are configured to secure the support to a securing structure within a housing of an electronic device.

17 Claims, 9 Drawing Sheets

US 8,947,884 B1

SUPPORT FOR A PRINTED CIRCUIT ASSEMBLY

TECHNICAL FIELD

The present disclosure relates to supporting a printed circuit assembly, such as a printed circuit assembly including LED indicators, within a housing structure.

BACKGROUND

Printed circuit assemblies (PCAs), which comprise circuit boards supporting electronic components, are used in many electronic devices. Typically, electronic devices include a chassis or support housing that surrounds and protects one or more PCAs, where each PCA is securely mounted in some manner within the protective housing.

In certain types of electronic devices, one or more PCAs are electrically coupled with indicator lights (e.g., light emitting diodes or LEDs), that form a display panel on an exterior surface of the protective housing. The indicator lights provide a visual indication of the operational status of the device. In a network switch product (e.g., an Ethernet switch) that includes a plurality of I/O connectors, each I/O connector may have its own dedicated light indicator to indicate an operational status associated with such I/O connection to a user relatively quickly. For example, an Ethernet switch product may be constructed such that a grid or array of LEDs are installed on a PCA within the protective housing of the device, and a series of light pipes are connected to the LEDs to direct light from each LED to a corresponding output light array on the exterior housing panel of the product.

Due to changing standards in product requirements for electronic devices (such as Ethernet switch products), there have been increasing challenges in providing suitable support structure for PCAs within the housing of the electronic device which facilitates easy installation of the PCA while ensuring the PCA is secure and operates effectively during use of the device.

DESCRIPTION OF EXAMPLE EMBODIMENTS

Overview

A device comprises a printed circuit assembly (PCA) comprising a printed circuit board and at least one electronic component integrated with the printed circuit board, and a support to which the PCA is securable. At least one of the PCA and the support includes engaging structure elements, and some engaging structure elements are configured to secure the PCA to the support while other engaging structure elements are configured to secure the support to a securing structure within a housing of an electronic device.

In addition, an electronic device comprises a housing including at least one housing wall, and an assembly securable to an interior surface of a housing wall. The assembly comprises a printed circuit assembly (PCA) including a printed circuit board and at least one electronic component integrated with the printed circuit board, and a support to which the PCA is securable. The support includes engaging structure elements are configured to secure the PCA to the support and to secure the support to a securing structure to the housing wall interior surface.

Further, a method comprises securing a PCA to a support, the PCA comprising a printed circuit board and at least one electronic component integrated with the printed circuit board, where at least one of the PCA and the support includes engaging structure elements, and some engaging structure elements are configured to secure the PCA to the support while other engaging structure elements are configured to secure the support to a securing structure within a housing of an electronic device.

Example Embodiments

Figure 1:
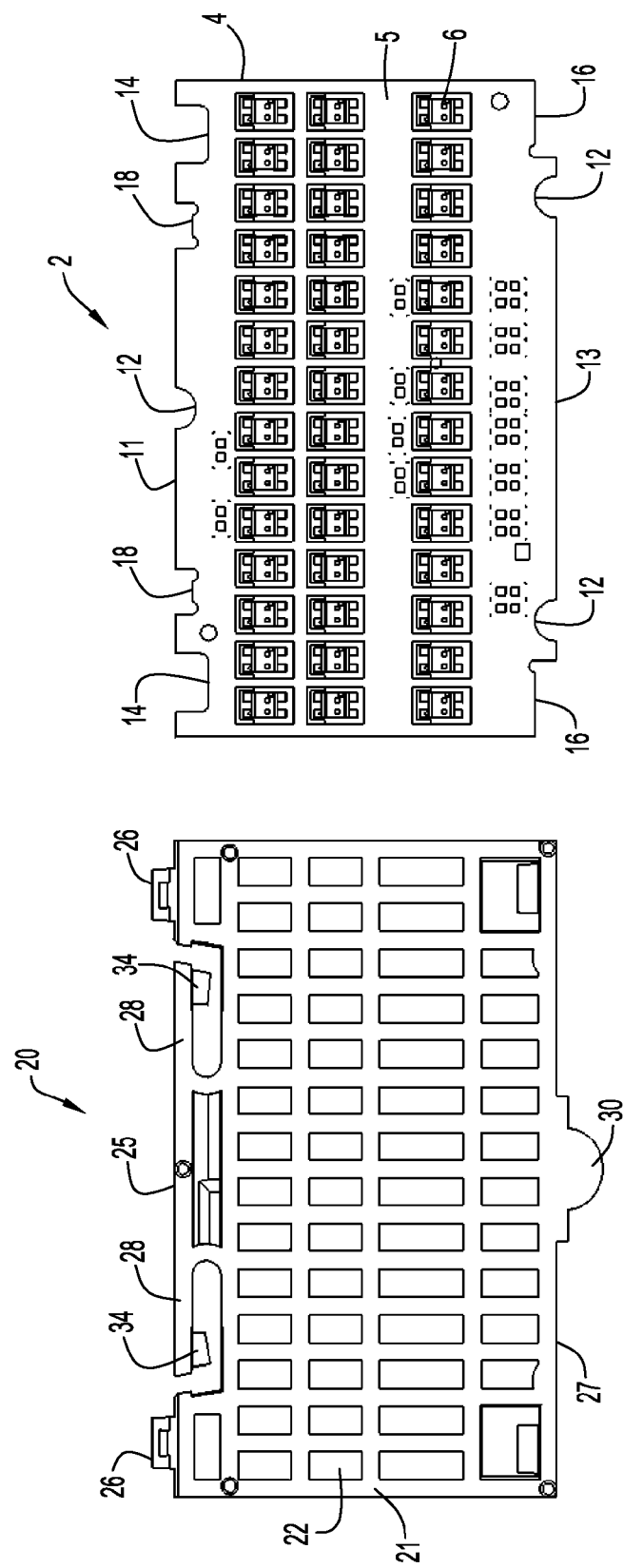
FIG. 1 is front view in plan of a printed circuit assembly separated from a support that secures the printed circuit assembly within the housing of an electronic device.
Figure 2:
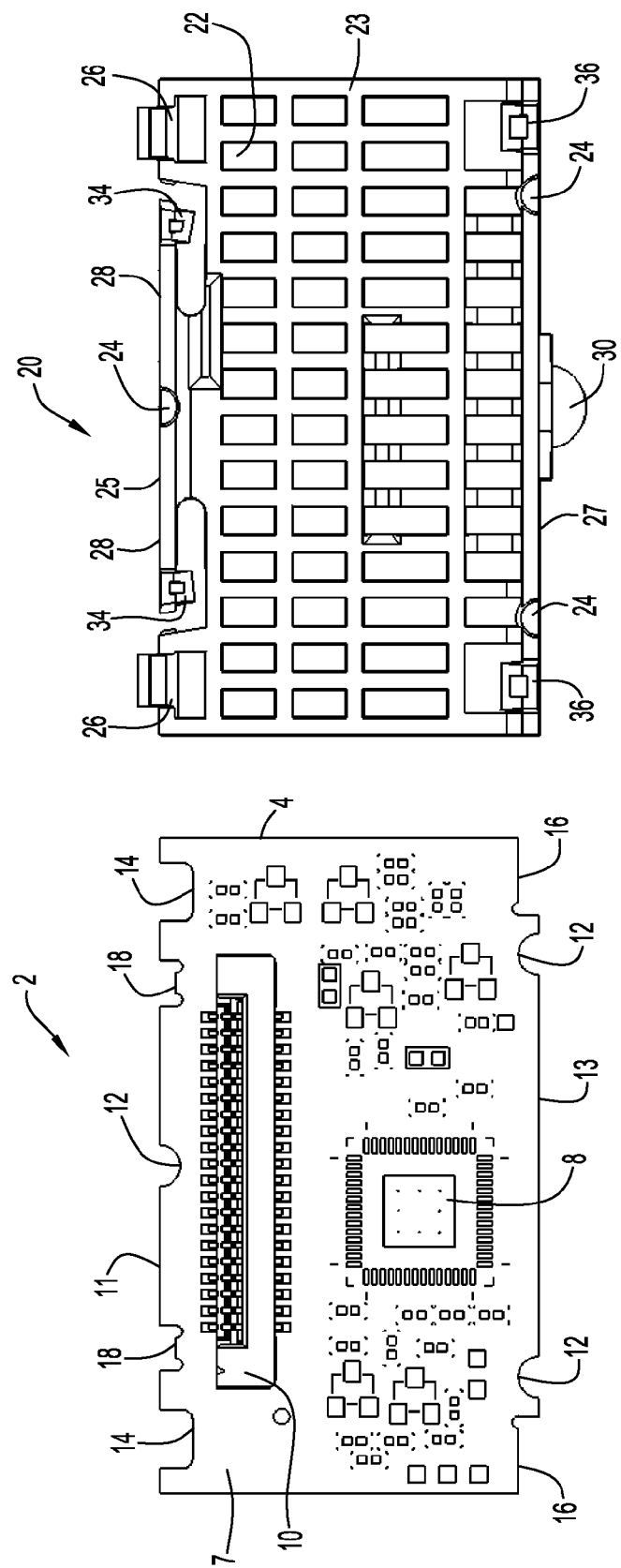
FIG. 2 is a rear view in plan of the printed circuit assembly separated from the support.
Figure 3:
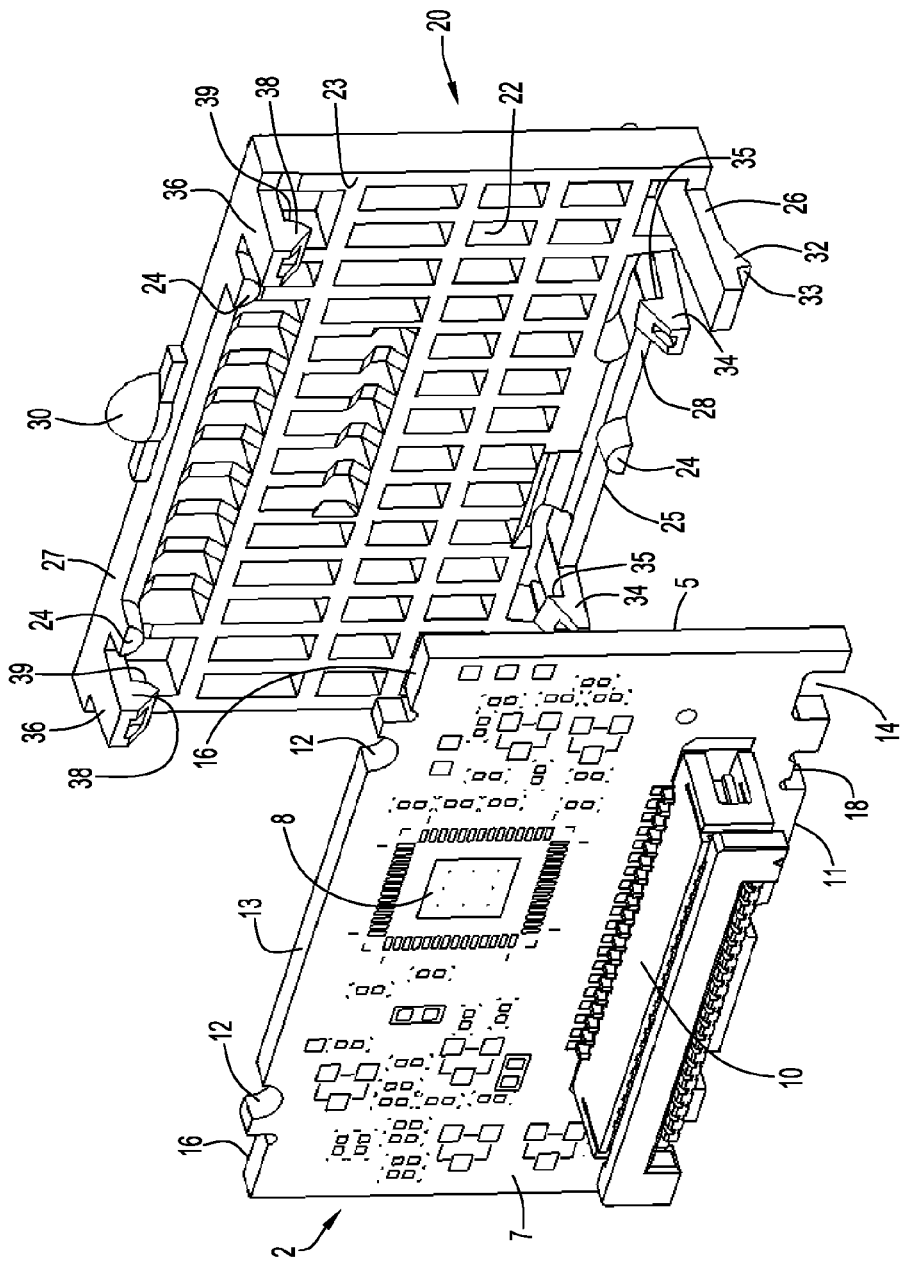
FIG. 3 is an exploded view in perspective of the printed circuit assembly with the support.
Figure 4:
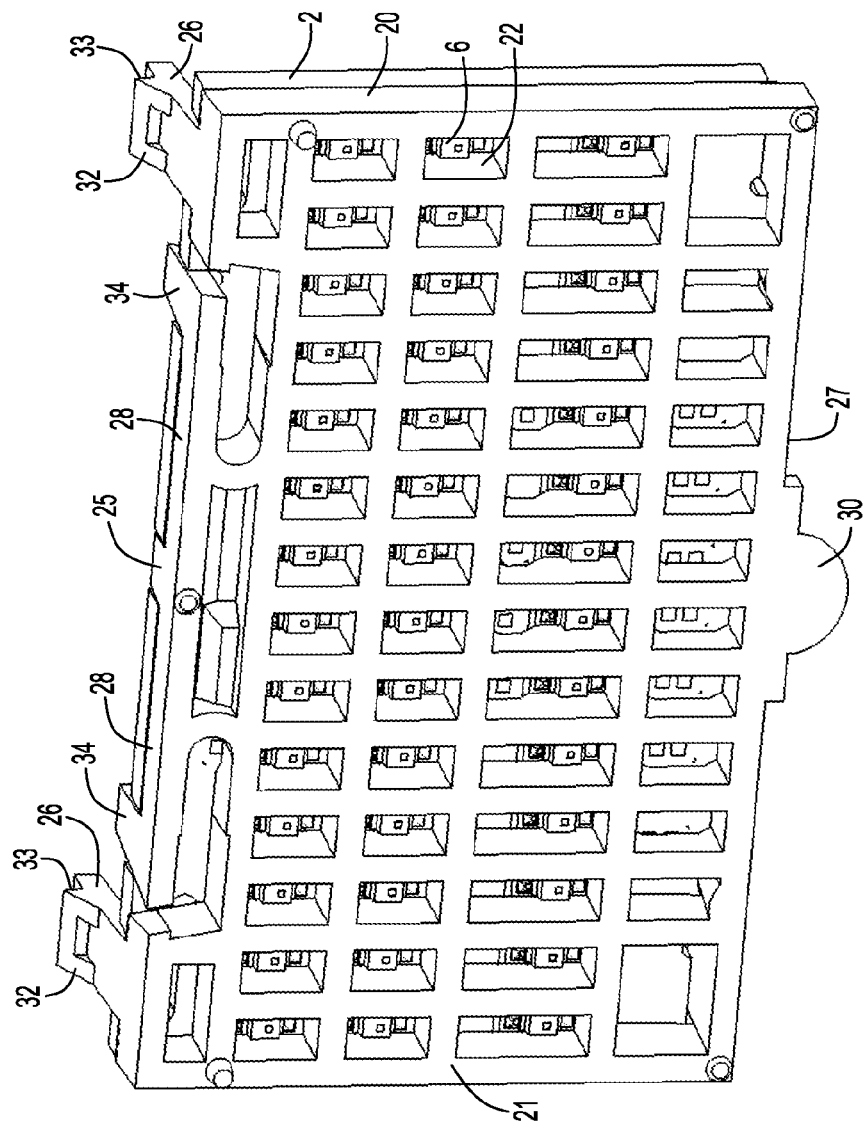
FIG. 4 is front view in perspective of the printed circuit assembly secured to the support.
Figure 5:
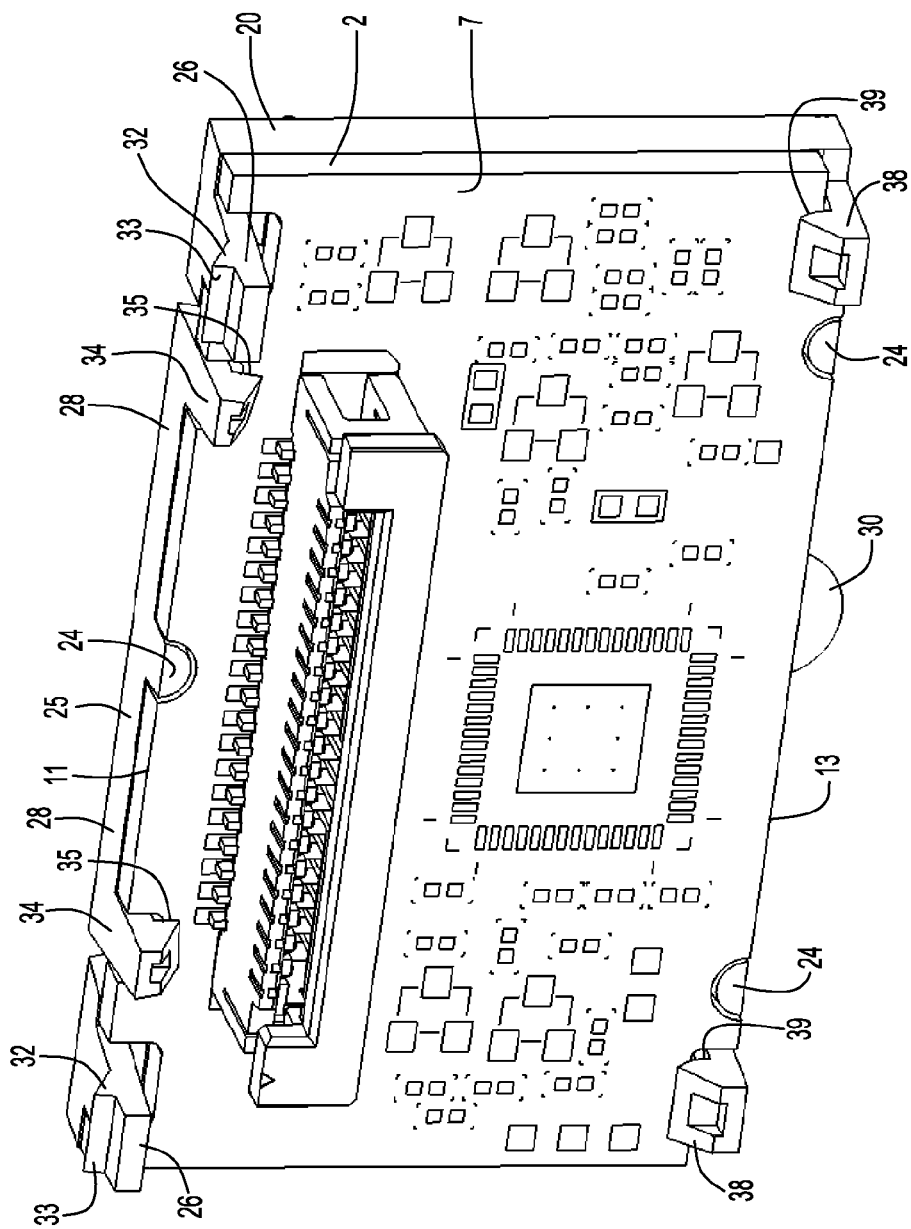
FIG. 5 is a rear view in perspective of the printed circuit assembly secured to the support.

Referring to FIGS. 1-5, a combined circuit board assembly (PCA) with support structure is depicted, including a PCA 2 and support 20 for the PCA 2. FIGS. 1-3 show the front and rear sides of the PCA 2 and support 20 separated from each other, while FIGS. 4 and 5 show front and rear views of the PCA 2 connected with the support 20.

As can be seen with reference to FIGS. 1 and 2, PCA 2 includes a generally rectangular shaped printed circuit board 4 including a plurality of electronic circuit components disposed on either side of the board 4 as well as suitable electrically conductive pathways integrated within the board 4. A plurality of indicator lights 6 (e.g., LEDs) are mounted on a front surface 5 of the board 4 and arranged in a series or array of rows (e.g., three rows as shown in FIG. 1) along the board surface. The indicator lights 6 are electrically connected with other electrical components generally depicted on front surface 5 and/or the rear surface 7 of the board 4. In an example embodiment, the PCA 2 can include forty two indicator lights 6 along with a plurality of electrical components (e.g., capacitors and resistors) mounted on the front surface 5 of the board 4, while the rear surface 7 of the board 4 includes a programmable flash chip 8, a FFC/FPC connector 10 (for connecting with flat flexible cables or flat printed circuits) and additional electrical components (e.g., capacitors and resistors) mounted to the board rear surface 7. The PCA 2 can be of any suitable size. The PCA 2 can further be sufficiently small in size (e.g., less than 2 inches in length and/or width dimension) in order to satisfy required dimensional specifications to fit at a particular location within the housing of the electronic device. However, it is noted that the PCA can have any other suitable configuration, including different numbers and types of indicator lights, electrical components, dimensions and/or geometric configurations.

The support 20 has a generally rectangular configuration that corresponds with the shape of the PCA 2 and further includes a plurality of generally rectangular shaped openings 22 that are aligned in an array of rows so as to correspond spatially with the indicator lights 6 of the PCA 2 when the PCA is secured to the support in the manner described below. Thus, in an example embodiment, the number of openings 22 in the support 20 is at least the same as the number of indicator lights 6 disposed on the front surface 5 of the PCA board 4. The support 20 includes a front surface 21 (from which the indicator lights 6 of the PCA 2 are visible through the windows 22) and a rear surface 23 which contacts or engages with the front surface 5 of the PCA board 4 when the PCA is connected to the support. The support 20 can be constructed of a suitable material (e.g., plastic) that forms an insulating barrier between the PCA and the interior of the housing when the PCA is mounted within the housing of the electronic device. In addition, the support 20 serves as a shroud for the indicator lights 6 of the PCA 2 to prevent or limit shadowing or bleeding between light indicators when the PCA and support are mounted within the electronic device. Bleeding of light refers to an undesired transmission of light from one indicator window to another on a display. For example, the support 20 can be constructed of an opaque material having a suitably light absorbing color (e.g., a dark color, such as black) to prevent bleeding of light from one indicator light 6 disposed within a first opening 22 to a second opening 22 of the support 20 that is in close proximity to the first opening 22.

Each of the PCA 2 and the support 20 includes customized alignment and connection features that facilitate easy connection of the PCA 2 to the support 20 as well as connection of the support 20 to an interior portion of the housing for an electronic component. Referring, for example, to FIGS. 1, 2 and 5, the PCA 2 includes cut-out portions 12 defined at the lengthwise edges 11, 13 of the board 4, where the cut-out portions 12 have a generally rounded or semicircular configuration that are aligned to engage with corresponding rounded or semicircular protrusions 24 disposed on the rear surface 23 at or near the lengthwise edges 25, 27 of the support 20.

The PCA 2 further includes a pair of generally rectangular cut-out sections 14 defined at the upper lengthwise edge 11 of the support board 4, where each cut-out section 14 is further located near a lengthwise end of the support 20. The lower lengthwise edge 13 of the board 4 also includes a pair of generally rectangular cut-out sections 16, where each cut-out section 16 is located near a lengthwise end of the board 4. Additional cut-out sections 18 are defined along the upper lengthwise edge 11 of the board 4 at locations between the cut-out sections 14.

The support 20 includes a pair of resilient flexible finger members 26 that extend transversely from the rear surface 23 of the support 20 and are suitably aligned along an upper lengthwise edge 25 of the support 20 to be received within corresponding cut-out sections 14 of the board 4 when the PCA 2 is mated with the support 20 (as shown in FIG. 5). Each finger member 26 includes a tab 32 at or near its free end, where each tab 32 extends upward from the finger member 26 in a direction away from the upper lengthwise edge 25 of the support 20. Each tab 32 has an inclined ramp configuration with an engaging surface 33 that is generally parallel with but faces away from the rear surface 23 of the support 20 (as shown in FIG. 5).

The support 20 further includes another pair of resilient finger members 28 that extend in a cantilevered manner and in a direction along the upper lengthwise edge 25 of the support 20. Each finger member 28 includes a tab 34 at a free end of the finger member, where the tab 34 extends transversely from the rear surface 23 of the support. Each tab 34 has an inclined ramp configuration extending in a direction downward and away from the upper lengthwise edge 25 of the support 20 so as to align within a corresponding cut-out section 18 of the PCA 2. An engaging surface 35 of each tab 34 is generally parallel and faces toward the rear surface 23 of the support 20 so as to engage with the rear surface 7 of the PCA 2 when the PCA is mounted to the support (as shown in FIG. 5).

Two resilient flexible finger members 36 also extend outward from the rear surface 23 of the support 20 and are suitably aligned along a lower lengthwise edge 27 of the support 20 to be received within corresponding cut-out sections 16 of the board 4 when the PCA 2 is mated with the support 20. Each finger member 36 includes a tab 38 having an inclined ramp configuration that extends upward and away from the lower lengthwise edge 27 of the support 20. Each tab 38 includes an engaging surface 39 that is generally parallel with and faces toward the rear surface 23 of the support 20 so as to engage with the rear surface 7 of the PCA board 4 when the PCA 2 is mounted to the support 20 (as shown in FIG. 5).

During assembly of components within the electronic device, the PCA 2 can be connected to the support 20 in a relatively easy manner. The PCA 2 is aligned with the support 20 in a manner such as is shown in FIG. 3, in which the front surface 5 of the PCA board 4 faces the rear surface 23 of the support 20 and the upper and lower lengthwise edges 11, 13 of the board 4 are aligned with the upper and lower lengthwise edges 25, 27 of the support 20. The PCA 2 is pressed against the support 20 such that the indicator lights 6 on the front surface 5 of the PCA 2 fit within corresponding window openings 22 of the support 20 and the board front surface 5 engages with the support rear surface 23. As the PCA 2 is pressed into contact with the support 20, the resilient finger members 26 and protrusions 24 of the support 20 fit within corresponding cut-out sections 14 and corresponding cut-out sections 12 of the PCA board 4. The resilient finger members 28 and 36 also fit within corresponding cut-out sections 18 and 16 of the PCA board 4 during the mounting of the PCA 2 to the support 20. The resilient finger members 28 of the support 20 are configured to flex in a slight manner in order to allow for the PCA board 4 to move past the tabs 34 on the finger members 28 in order to reach its mounted position (as shown in FIGS. 4 and 5). In addition, the resilient finger members 36 of the support 20 are also configured to slightly flex in order to allow the PCA board 4 to move past tabs 38 to reach its mounted position. When the PCA board 4 moves beyond the tabs 34, 38 of the finger members 28, 36 to its mounted position, the resilient finger members 28, 36 are configured to move back to their original, unflexed position, while the engaging surfaces 35, 39 of the tabs 34, 38 engage with the rear surface 7 of the PCA board 4.

As can be seen in FIGS. 4 and 5, the various contact points between the engaging surfaces 35, 39 of the support finger members 28, 36 as well as the engagement of finger members 26 within corresponding cut-out sections 14 and protrusions 24 within corresponding cut-out sections 12 results in a secure connection between the PCA 2 and support 20, with indicator lights 6 of the PCA 2 being received within corresponding windows or openings 22 of the support 20. This connection comprises a mechanical, snap-tight securing arrangement between PCA 2 and support 20 that is achieved without the requirement of any fasteners (e.g., screws) or other hardware. Further, this mechanical connection allows for easy securing of the PCA 2 to the support 20 as well as removal of the PCA 2 from the support 20 without the need for any assembly tools. For example, the PCA 2 can be removed from its mounted position with respect to the support 20 by flexing finger members 28 and/or finger members 36 such that the tabs 34 and/or tabs 38 are moved away from engagement with the board 4 to allow release of the PCA 2 from its locked position and movement away from the support 20.

Figure 6:
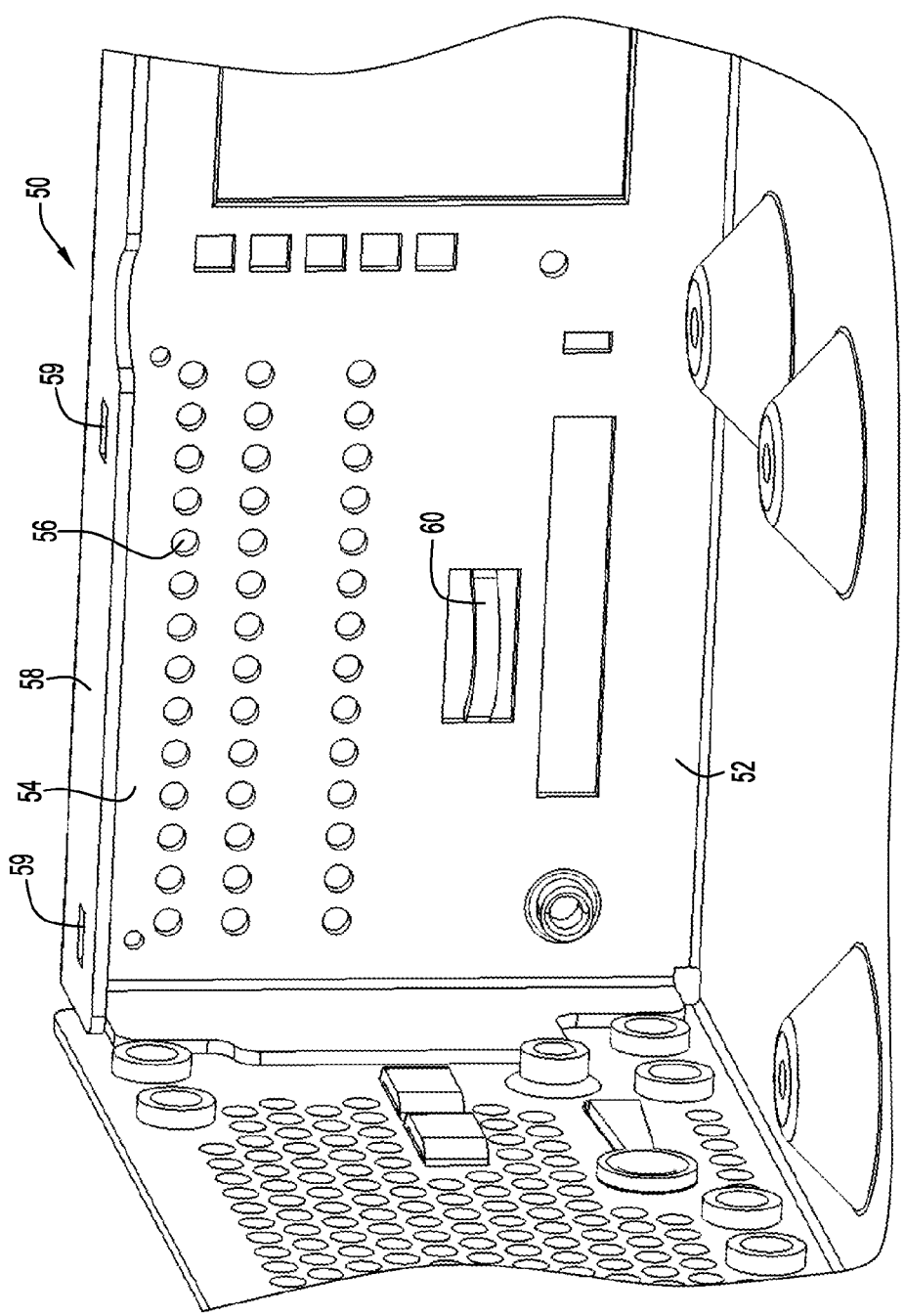
FIG. 6 is a partial view in perspective of the interior of a protective chassis or housing of an electronic device including an interior housing side wall configured to receive the printed circuit assembly with support of FIGS. 1-5.
Figure 7:
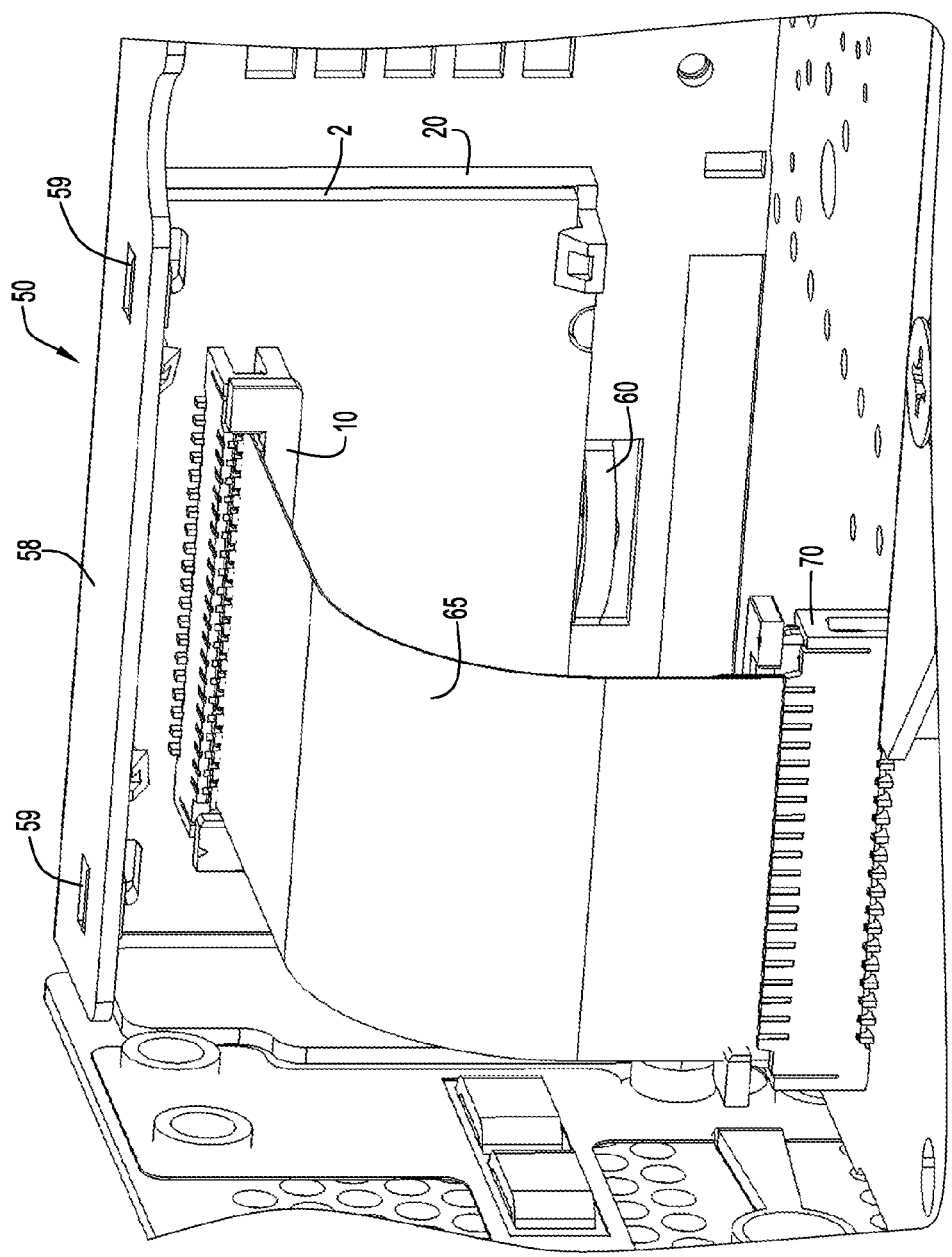
FIG. 7 is a partial view in perspective of the interior of an electronic device of FIG. 6 including the printed circuit assembly and support of FIGS. 1-5 secured to the interior housing side wall.

Securing of the combined PCA and support assembly within the chassis or housing of an electronic device is now described with reference to FIGS. 5-8. It is noted that the chassis or housing walls of the electronic device can be formed of a sheet metal and/or any other suitably rigid material that protects the electronic components provided within the housing. The interior of a chassis or housing 50 of an electronic device is depicted in FIGS. 6 and 7, including an interior surface 54 of a sidewall 52 of the housing 50. In an example embodiment, the electronic device can be a computer networking device such as a network switch product (e.g., an Ethernet switch), in which the device includes an external display panel that displays the various indicator lights 6 of the PCA 2, where the indicator lights 6 provide an indication of an operational condition for corresponding I/O connectors of the switch device. However, it is noted that the electronic device can be any type of device that requires printed circuit arrangements such as a PCA to be securely mounted within the device housing.

The housing sidewall 52 includes a plurality of windows or openings 56 that correspond with the support openings 22 such that the indicator lights 6 of the PCA 2 align with corresponding openings 56 of the sidewall 52 when the combined PCA/support assembly (as shown in FIGS. 4 and 5) is secured to the sidewall 52 within the housing interior in the manner described below. A ledge 58 extends from the sidewall 52 in a direction away from the interior surface 54 and at a location above the sidewall openings 56. It is noted that the ledge 58 could be defined within the housing interior or, alternatively, located at an upper edge of the sidewall 52 so as to define a portion of another sidewall of the housing (e.g., an upper housing sidewall). Defined at spaced apart locations along the ledge 58 are two generally rectangular cut-out sections or openings 59 that are suitably aligned and dimensioned to receive and retain the tabs 32 for finger members 26 of the support 20 when the PCA/support assembly is mounted within the housing interior of the device.

A curved support band 60 is connected to the interior surface 54 of the sidewall 52 at a location below the sidewall openings 56, where the curved band 60 includes a portion that extends from the sidewall interior surface 54 that provides a gap between the band 60 and the sidewall interior surface 54. The support 20 includes a generally curved protrusion 30 extending from the lower lengthwise edge 27 of the support 20. The curved protrusion 30 is aligned along the support 20 so as to fit within the gap defined by the band 60 when the tabs 33 are received within the openings 59 of the ledge 58 during mounting of the PCA/support assembly within the interior of the device housing 52.

The PCA/support assembly (depicted in FIGS. 4 and 5) secures to the interior surface 54 of the housing sidewall 52 by positioning the assembly into the housing interior and fitting the assembly such that the front surface 21 of the support 20 engages the sidewall interior surface 54. The PCA/support assembly can be initially aligned at a slight angle in relation to the sidewall interior surface 54, with the lower lengthwise edge 27 being closer to the interior surface 54 in relation to the upper lengthwise edge 25, such that the curved protrusion 30 of the support 20 is fit within the gap defined between the band 60 and the sidewall interior surface 54. The PCA/support assembly is then positioned such that the upper lengthwise edge 25 of the support 20 is moved closer to the sidewall interior surface 54. During such movement, the resilient finger members 26 are slightly flexed to permit the tab 32 of each finger member 26 to fit in a snap tight locking relationship within the corresponding opening 59 defined along the ledge 58 (with the engaging surfaces 33 of tabs 32 engaging wall surface portions defining the cut-out sections 59 of the ledge 58). When each tab 32 is fit within its corresponding opening 59 of the ledge 58, the finger members 26 move back to their original, unflexed position such that the PCA/support assembly is firmly secured in place with respect to the housing sidewall 52, with the front surface 21 of the support 20 engaging the sidewall interior surface 54 and indicator lights 6 of the PCA 2 and corresponding openings 22 of the support 20 being aligned with corresponding openings 56 along the sidewall 52. As shown in FIG. 7, the FFC/FPC connector 10 of the PCA 2 connects, via a flat flexible cable structure 65, to another FFC/FPC connector 70 secured at another location (e.g., another sidewall) within the interior of the housing 50 of the electronic device. This electrically connects the various circuit components supported by the board 4 of the PCA 2 to other PCAs and/or other circuit components of the electronic device.

Figure 8:
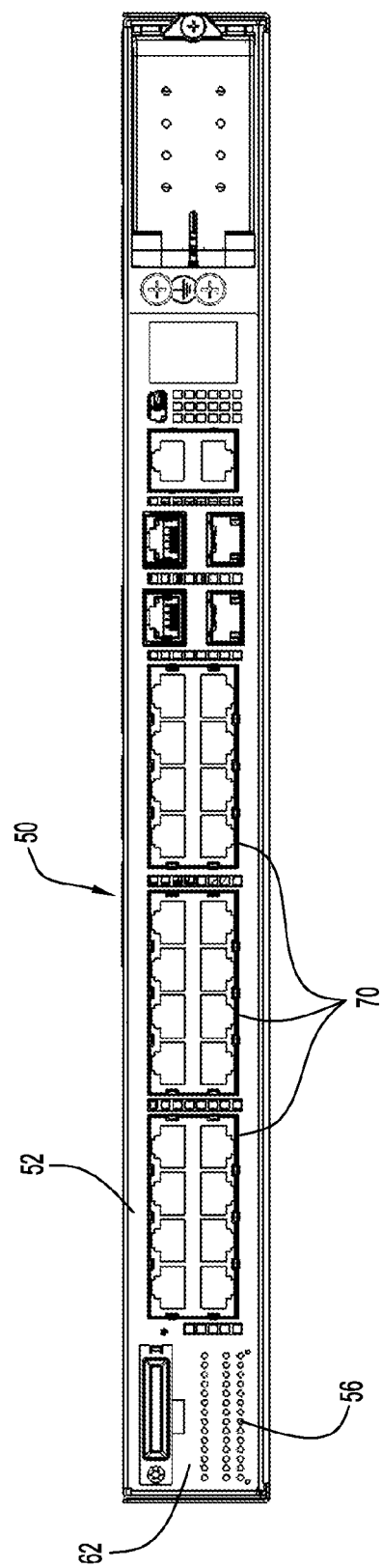
FIG. 8 is an elevated view of an exterior surface of the electronic device of FIG. 6
Figure 9:
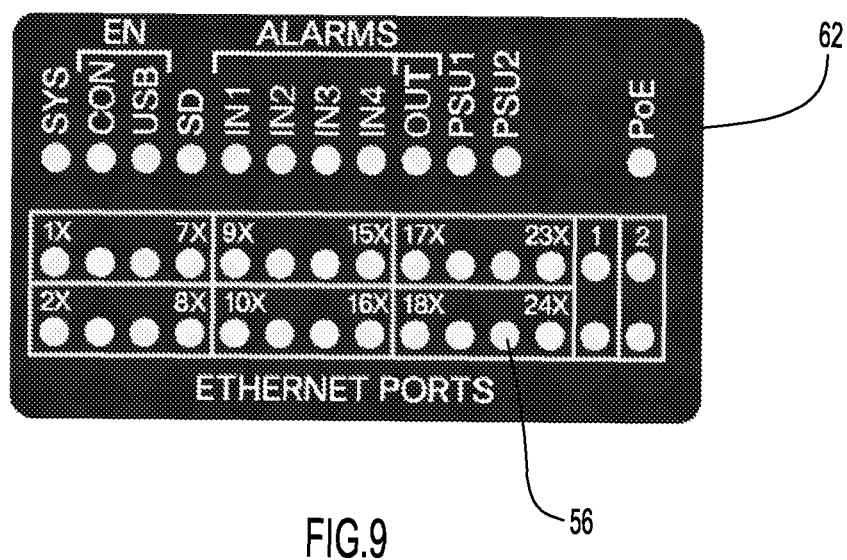
FIG. 9 is a view of an overlay provided to the exterior surface of the electronic device of FIG. 8, where the overlay defines an indicator display panel for the electronic device.

Referring to FIG. 8, an exterior surface 62 of the housing sidewall 52 is shown, including the openings 56 that correspond with the indicator lights 6 of the PCA 2 mounted with the support 20 along the sidewall interior surface 54. The exterior surface 62 also includes a plurality of input and output (I/O) ports for connecting various network connectors and other types of connecting cables to the device. The exterior surface 62 may further include a graphic overlay for the array of openings 56 or any other suitable indicia associated with each opening 56 to provide a visual display regarding which indicator light 6 corresponds with which I/O connector or the type of indication each light 6 provides in relation to operation of the device. For example, the indicator lights can provide an operability status of different network ports for the device (such as network ports 70 shown in FIG. 8) or various types of alarm and/or other types of indications based upon whether and/or what color a light emits from an indicator window opening 56. An example embodiment of an overlay for the exterior surface 62 of the housing sidewall 52 and providing indicia corresponding to the openings 56 (which also corresponds to the indicator lights 6 aligned with such openings 56) is shown in FIG. 9.

The support 20 acts as a shroud to prevent bleeding of light emitted from an indicator light 6 disposed within one opening 22 in the support 20 to another opening 22, and this in turn prevents bleeding of light from one indicator opening 56 to another indicator opening 56 on the external display surface 62 of the housing 50.

As previously noted, the support 20 is constructed of a suitable material (e.g., plastic) to enable the support to serve as a shroud for the indicator lights 6 of the PCA 2 and also as an electrical insulating member between the PCA 2 and housing sidewall sections and/or other components within the housing of the device. In addition, the support 20 and also PCA board 4 and components on the board 4 are constructed of suitable materials to enable use of the PCA/board assembly in environments in which the operating temperatures within a device housing can be within the range from about −40° C. to about 85° C. For example, the PCA/assembly can be integrated within devices that are used in environments with no HVAC air flow systems and/or within devices that do not utilize fans or other forced fluid cooling mechanisms to cool components within the device.

Thus, the connection between the PCA/support assembly and the housing sidewall 52 of the electronic device provides an easy, snap-tight fitting connection that is similar to the connection between PCA 2 and support 20 in that no fasteners (e.g., screws) or hardware or any additional assembly tools are required to mount the PCA/support assembly within the housing. In addition, the PCA/support assembly can be removed from the housing sidewall 52 by flexing the finger members 26 in a manner that removes the tabs 32 from the openings 59 in the ledge 58 in order to facilitate movement of the PCA/support assembly away from the sidewall interior surface 54.

The various cut-out sections, protrusions and resilient finger members provide an easy mechanism for securing the PCA to the support and the combined PCA/support assembly directly to a sidewall of the housing. This allows an easy connection of the PCA within the housing without the need for additional fasteners and/or other assembly tools. The PCA/support assembly also allows connection of the light supporting surface of the PCA directly to an interior wall surface of the housing to allow the indicator lights of the PCA to emit directly from openings within the housing wall, thus obviating the need for light pipes or other mechanisms to direct light from the indicator lights from the housing interior to an external panel display of the electronic device. Further, the support acts as a shroud to prevent or minimize unwanted or undesirable bleeding of light from one indicator light opening to another (which might otherwise provide a false indicator of some operational feature of the device). The support further provides an insulating barrier between the PCA and the metal chassis or housing wall to which the support is secured and/or other conductive components within the housing of the electronic device.

The snap-tight fitting design features of the PCA and support facilitate connection of the PCA/support assembly to many different areas within the housing of the electronic device, such as different housing walls (e.g., side walls, bottom walls, top walls, etc.) and at varying angles within the housing. The PCA/support assembly design can further be implemented for use in securely mounting any type of PCA structure (e.g., a PCA with our without LEDs or other types of indicator lights) with relative ease within any type of electronic device. In the example embodiments described above, the indicator lights for the PCA can be of any suitable numbers and types, and they can be provided in any suitable type of configuration to combine with an overlay that provides multiple indications of operating conditions of the device based upon one or combinations of indicator lights emitting light during operation of the device.

The above description is intended by way of example only.

What is claimed is:

1. A device comprising:
   a printed circuit assembly (PCA) comprising a printed circuit board and at least one electronic component integrated with the printed circuit board, wherein a first surface of the printed circuit board includes a plurality of indicator lights and a second surface of the printed circuit board that opposes the first surface of the printed circuit board includes the at least one electronic component; and
   a support including a first surface to which the PCA is securable and a second surface that opposes the first surface of the support;
   wherein:
   at least one of the PCA and the support includes engaging structure elements, some of the engaging structure elements are configured to secure the PCA to the support while other engaging structure elements of the support are configured to engage with and secure the support to a securing structure within a housing of an electronic device such that the second surface of the support faces an interior surface of a housing wall of the electronic device, and the support includes a plurality of openings extending through the support between the first and second surfaces of the support with each opening being aligned with a corresponding indicator light when the PCA is secured to the support with the first surface of the printed circuit board facing the support such that light emitting from each indicator light passes through the corresponding opening of the support; and the housing wall of the electronic device to which the support is configured to be secured includes an indicator panel disposed at an exterior surface of the housing wall, the indicator panel including a plurality of openings extending through the housing wall, and the support is further configured such that connection of the support with the housing wall interior surface results in each opening of the housing wall corresponding with a support opening such that light emitting from each indicator light of the PCA is visible through a corresponding housing wall opening.

2. The device of claim 1, wherein one of the engaging structure elements disposed on the PCA comprises at least one cut-out section that engages with a corresponding engaging structure element of the engaging structure elements that is disposed on the support to secure the PCA to the support.

3. The device of claim 2, wherein the at least one engaging structure element of the engaging structure elements that is disposed on the support comprises a flexible finger member that fits within a corresponding cut-out section of the PCA when the PCA is engaged with the support.

4. The device of claim 1, wherein the support is configured as a light shroud for each indicator light to prevent bleeding of light emission from a first support opening corresponding with an indicator light to a second support opening.

5. The device of claim 1, wherein engaging structure elements of the support comprise at least one flexible finger member that engages with a corresponding cut-out section of the housing wall interior surface.

6. The device of claim 1, wherein the support provides an electrically insulating barrier between the PCA and the housing wall.

7. An electronic device comprising:
   a housing including a housing wall; and
   an assembly securable to an interior surface of a housing wall, the assembly comprising:
   a printed circuit assembly (PCA) comprising a printed circuit board and at least one electronic component integrated with the printed circuit board, wherein a first surface of the printed circuit board includes a plurality of indicator lights and a second surface of the printed circuit board that opposes the first surface of the printed circuit board includes the at least one electronic component; and
   a support including a first surface to which the PCA is securable and a second surface that opposes the first surface of the support, wherein the support includes engaging structure elements configured to secure the PCA to the support and to secure the support to a securing structure of the housing wall interior surface such that the second surface of the support faces the housing wall interior surface, and the support includes a plurality of openings extending through the support between the first and second surfaces of the support with each opening being aligned with a corresponding indicator light when the PCA is secured to the support with the first surface of the printed circuit board facing the support such that light emitting from each indicator light passes through the corresponding opening of the support;

wherein the housing wall includes an indicator panel disposed at an exterior surface of the housing wall, the indicator panel including a plurality of openings extending through the housing wall, wherein each opening of the housing wall corresponds with a support opening when the support is secured to the housing wall such that light emitting from each indicator light of the PCA is visible through a corresponding housing wall opening.

8. The electronic device of claim 7, wherein the electronic device comprises a computer networking device.

9. A method comprising:

securing a printed circuit assembly (PCA) to a first surface of a support, the support including a second surface that opposes the first surface of the support, the PCA comprising a printed circuit board and at least one electronic component integrated with the printed circuit board, wherein a first surface of the printed circuit board includes a plurality of indicator lights and a second surface of the printed circuit board that opposes the first surface of the printed circuit board includes the at least one electronic component, at least one of the PCA and the support includes engaging structure elements, some of the engaging structure elements are configured to secure the PCA to the support while other engaging structure elements are configured to secure the support within an electronic device, and the support includes a plurality of openings extending through the support between the first and second surfaces of the support with each opening being aligned with a corresponding indicator light when the PCA is secured to the support with the first surface of the printed circuit board facing the support such that light emitting from each indicator light passes through the corresponding opening of the support; and securing the support to an interior surface of a housing wall of the electronic device by engaging a securing structure of the housing wall with corresponding engaging structure elements of the support, wherein the housing wall includes an indicator panel disposed at an exterior surface of the housing wall, the indicator panel including a plurality of openings extending through the housing wall, and each opening of the housing wall corresponds with a support opening when the support is secured to the housing wall such that light emitting from each indicator light of the PCA is visible through a corresponding housing wall opening.

10. The method of claim 9, wherein the securing comprises engaging at least one cut-out section of the PCA with a corresponding engaging structure element of the engaging structure elements and disposed on the support.

11. The method of claim 10, wherein the securing further comprises fitting a flexible finger member of the support within a corresponding cut-out section of the PCA.

12. The method of claim 9, wherein the support is configured as a light shroud for each indicator light to prevent bleeding of light emission from a first support opening corresponding with an indicator light to a second support opening when the PCA is secured to the support.

13. The method of claim 9, wherein the support provides an electrically insulating barrier between the PCA and the housing wall.

14. The method of claim 9, wherein the housing wall forms a portion of a computer networking device.

15. The device of claim 1, wherein the support and the PCA are located entirely within the housing when the support is secured to the securing structure within the housing of the electronic device.

16. The electronic device of claim 7, wherein the support and the PCA are located entirely within the housing when the support is secured to the securing structure within the housing of the electronic device.

17. The method of claim 9, wherein the support and the PCA are located entirely within the housing when the support is secured to the securing structure within the housing of the electronic device.

* * * * *